United States Patent
Fan et al.

(10) Patent No.: US 10,324,111 B2
(45) Date of Patent: Jun. 18, 2019

(54) APPARATUSES, SYSTEMS AND METHODS FOR TESTING ELECTRICAL FUNCTIONS

(71) Applicants: BOE Technology Group Co., Ltd., Beijing (CN); Hefei Xinsheng Optoelectronics Technology Co., Ltd., Anhui (CN)

(72) Inventors: Wenjin Fan, Beijing (CN); Lei Zhang, Beijing (CN); Zongjie Guo, Beijing (CN); Qingpu Wang, Beijing (CN); Qin Zeng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 46 days.

(21) Appl. No.: 15/648,668

(22) Filed: Jul. 13, 2017

(65) Prior Publication Data

US 2018/0024164 A1   Jan. 25, 2018

(30) Foreign Application Priority Data

Jul. 22, 2016 (CN) .......................... 2016 1 0584689

(51) Int. Cl.
| | |
|---|---|
| *G01R 1/073* | (2006.01) |
| *G01R 31/28* | (2006.01) |
| *G01R 1/04* | (2006.01) |

(52) U.S. Cl.
CPC ....... *G01R 1/07314* (2013.01); *G01R 1/0416* (2013.01); *G01R 1/0425* (2013.01); *G01R 31/2889* (2013.01)

(58) Field of Classification Search
None
See application file for complete search history.

(56) References Cited

U.S. PATENT DOCUMENTS

| 4,587,481 A | 5/1986 | Lischke et al. |
| 6,704,670 B2 * | 3/2004 | McTigue ........... G01R 1/06766 324/149 |

(Continued)

FOREIGN PATENT DOCUMENTS

| CN | 1378088 A | 11/2002 |
| CN | 1380981 A | 11/2002 |

(Continued)

OTHER PUBLICATIONS

First Office Action, including Search Report, for Chinese Patent Application No. 201610584689.6, dated Aug. 3, 2018, 21 pages.

*Primary Examiner* — Clayton E. LaBalle
*Assistant Examiner* — Jas A Sanghera
(74) *Attorney, Agent, or Firm* — Westman, Champlin & Koehler, P.A.

(57) ABSTRACT

The embodiments of the present disclosure provide an apparatus, system and method for testing electrical functions. The apparatus for testing electrical functions comprises: at least one clamping tool configured to be capable of being clamped in the vicinity of at least one bonding area of an electronic device; at least one row of probes configured to be electrically connected to multiple pins in the at least one bonding area respectively when the at least one clamping tool is clamped; and at least one multiplex switch. Each multiplex switch has a first terminal comprising multiple ports, and a second terminal comprising at least one port and capable of being connected to a measurement instrument, and the at least one multiplex switch is configured to turn on or turn off an electrical connection between the multiple ports of the first terminal and at least one port of the second terminal.

20 Claims, 4 Drawing Sheets

(56) References Cited

U.S. PATENT DOCUMENTS

| | | |
|---|---|---|
| 6,777,949 B2 | 8/2004 | Tsuji et al. |
| 6,972,573 B2 | 12/2005 | Ishioka et al. |
| 7,112,967 B2 | 9/2006 | Tsuji et al. |
| 2011/0031990 A1* | 2/2011 | Patterson ............. G01R 1/0408 324/755.05 |

FOREIGN PATENT DOCUMENTS

| | | |
|---|---|---|
| CN | 201917623 U | 8/2011 |
| CN | 103698915 A | 4/2014 |
| CN | 104965323 A | 10/2015 |
| CN | 105182013 A | 12/2015 |
| EP | 0 107 771 A1 | 5/1984 |
| JP | 2000-206182 A | 7/2000 |

* cited by examiner

APPARATUSES, SYSTEMS AND METHODS FOR TESTING ELECTRICAL FUNCTIONS

CROSS-REFERENCE TO RELATED APPLICATION(S)

This application claims priority to the Chinese Patent Application No. 201610584689.6, filed on Jul. 22, 2016, entitled "APPARATUSES, SYSTEMS AND METHODS FOR TESTING ELECTRICAL FUNCTIONS," which is incorporated herein by reference in its entirety.

TECHNICAL FIELD

Embodiments of the present disclosure relate to testing of electrical functions of electronic devices, and more particularly, to apparatuses, systems and methods for testing electrical functions.

BACKGROUND

In production of touch panels, electrical functions of a touch panel product need to be tested. Conventionally, devices for testing electrical functions which are commonly used have relatively large sizes. For a large-size touch panel product, a device for testing functions is expensive. In addition, it needs to test functions of a touch panel in different places. However, due to a huge volume, the conventional device for testing functions cannot meet the requirements for portability.

Therefore, there is a need for a solution of testing electrical functions which can mitigate the disadvantages described above.

SUMMARY

According to an aspect of the embodiments of the present disclosure, there is provided an apparatus for testing electrical functions, comprising: at least one clamping tool configured to be capable of being clamped in a vicinity of at least one bonding area of an electronic device; at least one row of probes configured to be electrically connected to multiple pins in the at least one bonding area respectively when the at least one clamping tool is clamped in the vicinity of the at least one bonding area of the electronic device; and at least one multiplex switch, wherein each multiplex switch has a first terminal comprising multiple ports and connected to at least one group of probes in a row of probes via a group of wires respectively, and a second terminal comprising at least one port and capable of being connected to a measurement instrument via wires, and the at least one multiplex switch is configured to be capable of turning on or turning off an electrical connection between each of the multiple ports of the first terminal and at least one port of the second terminal.

According to another aspect of the embodiments of the present disclosure, there is provided a system for testing electrical functions, comprising: the apparatus for testing electrical functions according to any embodiment of the present disclosure, and the measurement instrument, wherein two ports of the second terminal of the at least one multiplex switch of the apparatus for testing electrical functions are connected to two ports of the measurement instrument via wires respectively to form a test loop.

According to a further aspect of the embodiments of the present disclosure, there is provided a method for testing electrical functions, comprising: clamping the apparatus for testing electrical functions according to any embodiment of the present disclosure in the vicinity of at least one bonding area of an electronic device to be tested through the at least one clamping tool, so that the at least one row of probes is electrically connected to multiple pins in the at least one bonding area respectively; connecting two ports of the second terminal of the at least one multiplex switch to two ports of a measurement instrument via wires to form a test loop; operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and measuring electrical functions between two pins which are connected to the specific two probes respectively using the measurement instrument.

DETAILED DESCRIPTION

In order to enable those skilled in the art to better understand the solutions of the present disclosure, the apparatus, system and method for testing electrical functions according to the embodiments of the present disclosure will be described in further detail below with reference to the accompanying drawings and detailed description. It is obvious that the described and illustrated embodiments and the various specific features thereof are merely illustrative of the present disclosure and are not intended to limit the present disclosure. All other embodiments and specific features thereof obtained by one of ordinary skill in the art based on the illustrative description without contributing any creative labor are within the protection scope of the present disclosure.

It is to be noted that, unless otherwise specified, in the description of the present disclosure, "multiple" means two or more; and orientations or positional relationships indicated by terms "upper", "lower", "left", "right", "inner", "outer", "front", "back", "head", "tail" etc. are orientations or positional relationships illustrated in the accompanying drawings, which are only for the purpose of facilitating the description of the present disclosure and simplifying the description, rather than indicating or implying that the referred apparatuses or elements must have a specific orientation or is constructed and operated in a particular orientation and therefore cannot be construed as limiting the present disclosure. In addition, terms "first", "second", "third" etc. are used for the purpose of description only and are not to be construed as indicating or implying relative importance.

It is to be further illustrated that, in the description of the present disclosure, unless otherwise expressly stated and defined, terms "installation", "connection", "link" should be broadly understood, for example, may be fixed or detachable connection, or integral connection; may be mechanical or electrical connection, or communication connection; may be direct connection, or may also be indirect connection via an intermediary. A specific meaning of the above-mentioned terms in the present disclosure will be apparent to those skilled in the art depending on specific situations.

Figure 1:
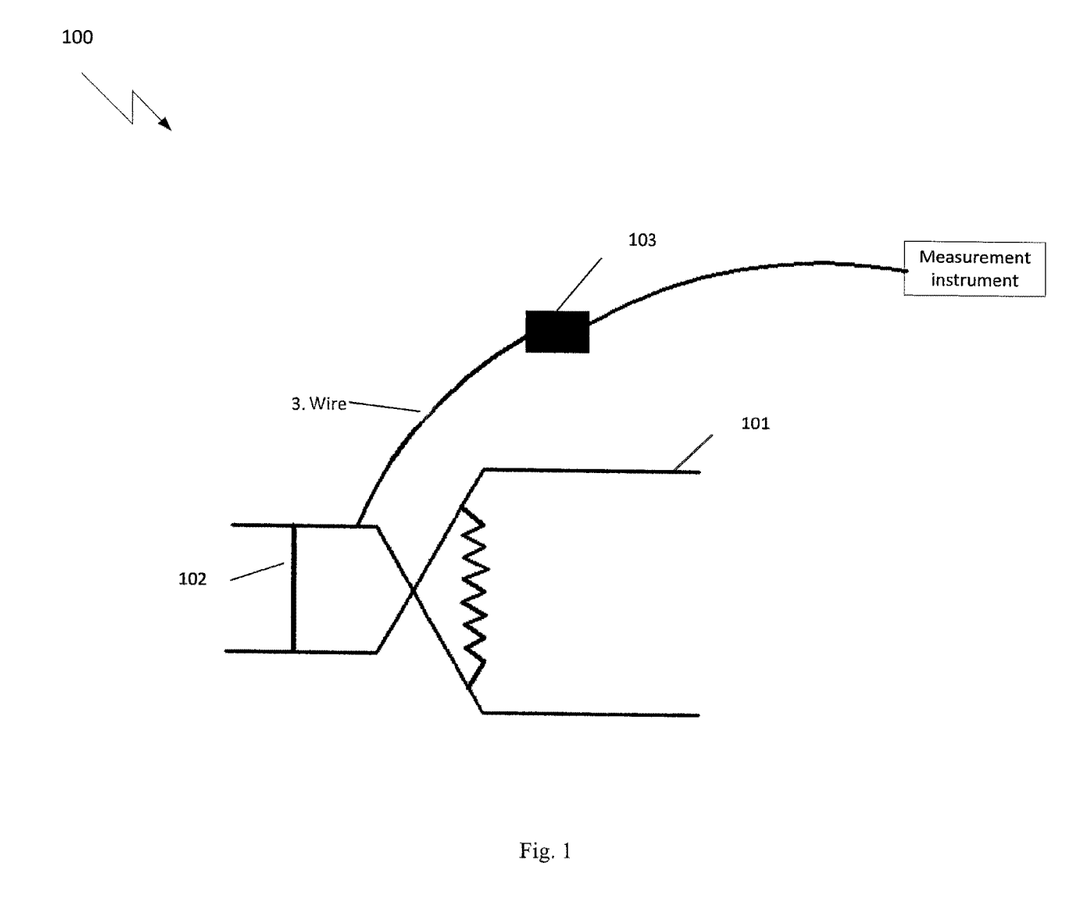
FIG. 1 illustrates an apparatus for testing electrical functions according to an embodiment of the present disclosure.

Referring now to FIG. 1, illustrated is an apparatus 100 for testing electrical functions according to an embodiment of the present disclosure. As shown in FIG. 1, the apparatus 100 for testing electrical functions comprises at least one clamping tool 101 configured to be capable of being clamped in the vicinity of at least one bonding area of an electronic device, including being clamped on the at least bonding area of the electronic device; at least one row of probes 102 configured to be electrically connected to multiple pins in the at least one bonding area respectively when the at least one clamping tool 101 is clamped in the vicinity of the at least one bonding area of the electronic device; and at least one multiplex switch 103, wherein each multiplex switch has a first terminal comprising multiple ports and connected to at least one group of probes in a row of probes via a group of wires 3 respectively, and a second terminal comprising at least one port and capable of being connected to a measurement instrument via wires, and the at least one multiplex switch is configured to be capable of turning on or turning off an electrical connection between each of the multiple ports of the first terminal and at least one port of the second terminal.

The at least one probe 102 is electrically connected to multiple pins in a bonding area of an electronic device such as a touch panel etc. by clamping the clamping tool 101 in the vicinity of the bonding area. Any two of the multiple pins are controlled by the multiplex switch to be electrically connected to two ports of the measurement instrument (for example, a multi-meter, a capacitance meter etc.) connected to the multiplex switch, so that measurement on electrical functions (such as a resistance, a voltage, a capacitance, an inductance etc.) between any two pins can be realized. Accordingly, the embodiments of the present disclosure provide a test apparatus or tool capable of effectively measuring electrical functions of an electronic device.

The electronic device may be any electronic device having a bonding area, such as a touch panel. Specifically, the electronic device may be, for example, a touch sensor of a touch panel. The bonding area may comprise a number of rows of pins, each pin having specific functions defined by design specifications of the electronic product. In addition, there should be specific electrical functions or performance defined by the design specifications of the electronic product between any two of the pins of the rows of pins. For example, there should be a specified voltage, resistance, current, inductance or reactance etc. between specific two pins. Functions or performance of the electronic product can be tested by using a measurement instrument 106 to test specific electrical functions between specific two pins to determine whether the electrical functions conform to the electrical functions between the two pins specified in the design specifications of the electronic product.

The measurement instrument may be any measurement instrument capable of testing specific electrical functions, such as a multi-meter for testing a voltage, a resistance, current, etc., a capacitance meter for testing a capacitance, an inductance detector for testing an inductance, etc.

The clamping tool 101 may be any apparatus or appliance which may be clamped in the vicinity of the bonding area of the electronic device to realize respective electrical connections between multiple probes in the at least one row of probes 102 and multiple pins in the bonding area. The clamping tool 101 may have any suitable shape, size and structure, so as to be capable of being stably bound in the vicinity of a bonding area of a specific electronic device. For example, the clamping tool 101 may be structurally similar to a long tail clip for clamping a stack of documents, and has a clip body and two tail handles. The clip body per se is a resilient steel sheet or is equipped with a spring, and has a front end which may be opened and closed. The clip body may be opened by pinching the two tail handles, and the clip body may be closed by releasing the two tail handles, so that the clamping tool 101 may be clamped in the vicinity of the bonding area of the electronic device or on the bonding area.

The row of probes 102 may be connected to or integrated with the clamping tool 101. Thus, when the clamping tool 101 is clamped in the vicinity of the bonding area of the electronic device or on the bonding area, the row of probes 102 may be in contact with the multiple pins in the bonding area, so as to realize respective electrical connections between the rows of probes 102 and the multiple pins. For example, in a case that the clamping tool 101 comprises a clip body, the row of probes 102 may be located on an inner surface of the clip body. Thus, when the clamping tool 101 is clamped on the bonding area of the electronic device, the row of probes 102 may be in contact with and electrically connected to the multiple pins of the bonding area respectively. The row of probes 102 may be made of a conductive material such as metal and, for example, is electrically insulated from the clamping tool 101. A wire 3 may be connected to one terminal of each probe in the row of probes 102 except for the other terminal which is in contact with and is electrically connected to the pins of the bonding area of the electronic device, and the wire 3 may be connected to a port of the first terminal of the multiplex switch 103.

A spacing of probes in the row of probes 102 may be the same as a spacing of pins in the bonding area of the electronic device, so that adjacent multiple probes 102 may be in contact with and connected to adjacent multiple pins respectively. Of course, it may also be considered that the spacing of the rows of probes 102 is an integer multiple of the spacing of the pins in the bonding area. A number of probes in the row of probes 102 may be the same as a number of pins in the bonding area of the electronic device, or may be greater than the number of pins in the bonding area of the electronic device, which can realize testing of the electrical functions of all the pins in the bonding area all at once. For example, if the number of probes in the row of probes 102 is 150, testing of a bonding area having pins less than or equal to 150 may be realized all at once. Of course, it may also be considered that the number of probes in the row of probes 102 is less than the number of pins in the bonding area. In this case, it is necessary to realize testing of the electrical functions of all the pins in the bonding area by performing the clamping operation many times.

In some embodiments, the spacing of the probes of the at least one row of probes 102 is adjustable. In this way, the spacing of the probes may be adapted to bonding areas with different spacing of different electronic devices, so that the electrical functions of the pins in the bonding areas of the different electronic devices can be tested. The adjustable spacing of the probes may be achieved by any known structure or manner in the related art.

The multiplex switch 103 may be any device which enables turn-on and turn-off of selective electrical connections between multiple ports of the first terminal and at least one port of the second terminal. In some embodiments, the multiplex switch 103 may enable turn-on and turn-off of the selective electrical connections in a mechanical or manual manner. Accordingly, the multiplex switch 103 may have a suitable mechanical and electrical structure. For example, the multiplex switch 103 may comprise one or two conductor pads, one terminal of which may be connected to a port of the second terminal of the multiplex switch 103 via a wire or is led out of the port. Further, the conductor pads may be moved and realize turn-on and turn-off of an electrical connection between the other terminal of the conductor pad and any one of the multiple ports of the first terminal of the multiplex switch 103.

For example, the multiplex switch 103 may enable turn-on and turn-off of the selective electrical connections by means of signal control. Accordingly, the multiplex switch 103 may have an appropriate circuit structure and an appropriate electronic device. For example, the multiplex switch 103 may comprise multiple transmission transistors, multiple input lines, an output line, and a number of programmable Static Random Access Memory (SRAM) units which are interconnected in a specific manner. Turn-on and turn-off of the multiple transmission transistors may be controlled by configuring content of the SRAM units, so as to select one of the multiple input lines to be connected with the output line. The multiplex switch may be a multiplexer or a data selector, for example, 1-out-of-n or 2-out-of-n multiplexer, where n is an integer greater than or equal to 2.

For example, the multiplex switch 103 is capable of controlling a turn-on time and/or an on-off order of an electrical connection between each port of the first terminal thereof and a port of the second terminal thereof. For example, the multiplex switch 103 is capable of sequentially controlling to turn on a connection between each port of the first terminal thereof and a port of the other terminal thereof for a predetermined time, so as to sequentially control to turn on an electrical connection between each of probes in the at least one row of probes 102 and a port of the second terminal thereof, thereby achieving sequential detection of electrical functions of each of the multiple pins in the bonding area connected to the at least one probe 102. The multiplex switch 103 may control a turn-on time of an electrical connection between each of the probes in the at least one row of probes 102 and a port of the second terminal thereof through a programmable control module. The programmable control module may control the turn-on time and order of the connection between each port of the first terminal of the multiplex switch 103 and a port of the second terminal according to a pre-programmed and stored program. The programmable control module may be implemented by a programmable controller, a processor or a control circuit and may be located outside the multiplex switch 103 and connected to the multiplex switch 103 or may also be located in the multiplex switch 103.

According to an embodiment of the present disclosure, the at least one clamping tool 101 comprises a clamping tool, the at least one row of probes 102 comprises a row of probes, the at least one multiplex switch 103 comprises a first multiplex switch and a second multiplex switch, multiple ports of a first terminal of the first multiplex switch are connected to a first group of probes in the row of probes 102 via a first group of wires respectively, and multiple ports of a first terminal of the second multiplex switch are connected to a second group of probes in the row of probes 102 via a second group of wires respectively. Thus, the apparatus 100 for testing electrical functions according to some of the embodiments of the present disclosure can test the electrical functions between any two pins in a bonding area of the electronic device.

Figure 2:
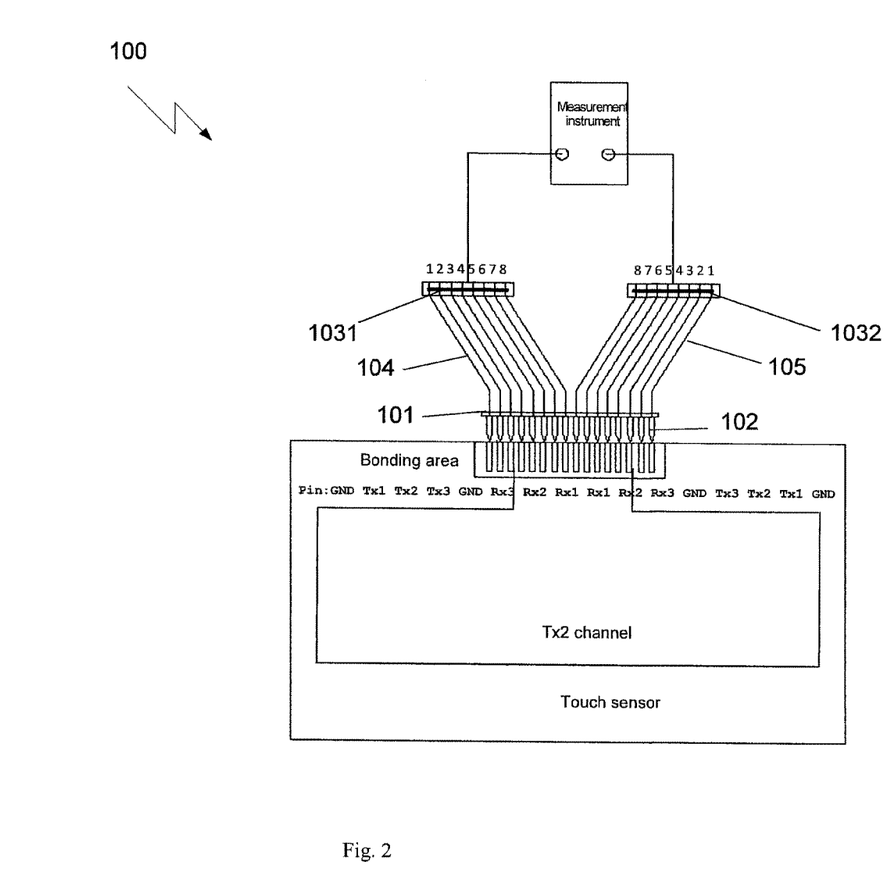
FIG. 2 schematically illustrates an apparatus for testing electrical functions and an example of a usage scenario thereof according to some embodiments of the present disclosure.

Referring now to FIG. 2, schematically illustrated is an apparatus 100 for testing electrical functions according to some of the embodiments of the present disclosure and an example of a usage scenario thereof. As shown in FIG. 2, the apparatus 100 for testing electrical functions comprises a clamping tool 101, a row of probes 102, a first multiplex switch 1031 and a second multiplex switch 1032. The row of probes 102 is connected to the clamping tool 101, for example, is located at the end of the clamping tool 101, and when the clamping tool 101 is clamped in the vicinity of the bonding area of the electronic device or on the bonding area, the row of probes 102 is electrically connected to the multiple pins in the bonding area respectively. A first group of probes in the row of probes 102 is connected to various ports of the first terminal of the first multiplex switch 1031 via a first group of wires 104 respectively, and a second group of probes in the rows of probes 102 is connected to various ports of the first terminal of the second multiplex switch 1032 via a second group of wires 105 respectively. A port of the second terminal of the first multiplex switch 1031 is connected to a port of the measurement instrument 106 via a wire, and a port of the second terminal of the second multiplex switch 1032 is connected to the other port of the measurement instrument 106 via another wire. A tester may operate the first multiplex switch 1031 to select any port of the first terminal of the first multiplex switch 1031, so that a connection between the port and a port of the second terminal of the first multiplex switch 1031 is turned on, and thereby connections between corresponding pins connected to corresponding probes in the first group of probes connected to corresponding wires in the first group of wires 104 connected to the port of the first terminal and one port of the measurement instrument 106 are turned on. Likewise, the tester may operate the second multiplex switch 1032 to select any port of the first terminal of the second multiplex switch 1032, so that a connection between the port and a port of the second terminal of the second multiplex switch 1032 is turned on, and thereby connections between corresponding pins connected to corresponding probes in the second group of probes connected to corresponding wires in the second group of wires 105 connected to the port of the first terminal and the other port of the measurement instrument 106 are turned on. In this way, the corresponding pins connected to the corresponding probes in the first group of probes, the two ports of the measurement instrument 106, and the corresponding pins connected to the corresponding probes in the second group of probes form a test loop, so that the measurement instrument 106 can be used to test electrical functions between the corresponding pins connected to the corresponding probes in the first group of probes and the corresponding pins connected to the corresponding probes in the second group of probes.

In FIG. 2, illustrated is a touch sensor having a 2T2R wiring acting as the electronic device, wherein each T channel comprises 3 Tx channels, and each R channel comprises 3 Rx channels. A bonding area of the electronic device has 16 pins which are defined from left to right as GND Tx1 Tx2 Tx3 GND Rx3 Rx2 Rx1 Rx1 Rx2 Rx3 GND Tx3 Tx2 Tx1 GND. The first group of probes connected to the multiple ports of the first terminal of the first multiplex switch 1031 are connected to 8 pins GND Tx1 Tx2 Tx3 GND Rx3 Rx2 Rx1 in a left portion of the bonding area respectively, and the second group of probes connected to the multiple ports of the first terminal of the second multiplex switch 1032 are connected to 8 pins Rx2 Rx3 GND Tx3 Tx2 Tx1 GND in a right portion of the bonding area respectively. The second terminals of the first multiplex switch 1031 and the second multiplex switch 1032 are connected to two terminals of the measurement instrument 106 respectively. The measurement instrument 106 is, for example, a multi-meter and is configured to measure a resistance. The first multiplex switch 1031 may be configured (for example, programmed) to turn on 8 pins connected to the first group of probes sequentially from left to right for a predetermined time (for example, 3 seconds). The second multiplex switch 1032 may be configured to synchronously turn on the 8 pins connected to the second group of probes sequentially from right to left for a predetermined time. Thus, for example, in 1st to 3rd seconds, a GND pin connected to a first probe from the left of the first group of probes is turned on, and a GND pin connected to a first probe from the right of the second group of probes is turned on. In 4th to 6th seconds, a Tx1 pin connected to a second probe from the left of the first group of probes is turned on, and a Tx1 pin connected to a second probe from the right of the second group of probes is turned on, so that a channel resistance of a Tx1 channel of the touch sensor can be measured by the multi-meter; and so on, the testing of the functions of various channel resistances of the entire touch sensor can be completed within about 24 seconds.

Figure 3:
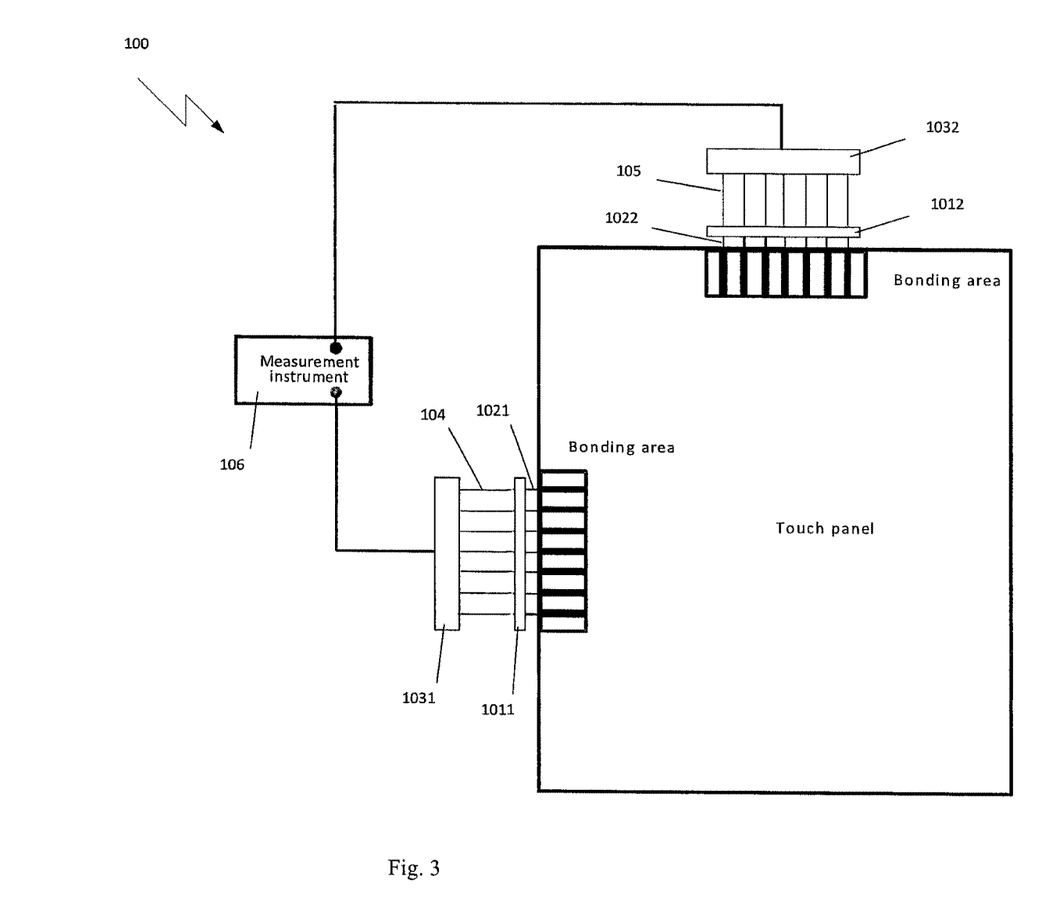
FIG. 3 schematically illustrates an apparatus for testing electrical functions and an example of a usage scenario thereof according to some other embodiments of the present disclosure.

According to some other embodiments of the present disclosure, the at least one clamping tool 101 comprises a first clamping tool and a second clamping tool, the at least one row of probes 102 comprises a first row of probes and a second row of probes, and is configured to cause the first row of probes to be electrically connected to multiple pins in a first bonding area of the electronic device respectively when the first clamping tool is clamped in the vicinity of the first bonding area, and cause the second row of probes to be electrically connected to multiple pins in a second bonding area of the electronic device respectively when the second clamping tool is clamped in the vicinity of the second bonding area, the at least one multiplex switch 103 comprises a first multiplex switch and a second multiplex switch, multiple ports of a first terminal of the first multiplex switch are connected to probes in the first row of probes via a first group of wires respectively, and multiple ports of a first terminal of the second multiplex switch are connected to probes in the second row of probes via a second group of wires respectively. Thus, the apparatus 100 for testing electrical functions according to the other embodiments of the present disclosure can enable the testing of the electrical functions between any two pins between two bonding areas of the electronic device.

Referring now to FIG. 3, schematically illustrated is an apparatus 100 for testing electrical functions and an example of a use scenario thereof according to the other embodiments of the present disclosure. As shown in FIG. 3, the apparatus 100 for testing electrical functions comprises a first clamping tool 1011 and a second clamping tool 1012, a first row of probes 1021 and a second row of probes 1022, and a first multiplex switch 1031 and a second multiplex switch 1032. The first row of probes 1021 is connected to the first clamping tool 1011, for example is located at an end of the first clamping tool 1011, and when the first clamping tool 1011 is clamped in the vicinity of the first bonding area of the electronic device or on the first bonding area, the first row of probes 1021 is electrically connected to multiple pins in the first bonding area respectively. The first row of probes 1021 is connected to various ports of a first terminal of the first multiplex switch 1031 via a first group of wires 104 respectively, and a port of a second terminal of the first multiplex switch 1031 is connected to one port of the measurement instrument 106 via a wire; the second row of probes 1022 is connected to the second clamping tool 1012, for example, is located at the end of the second clamping tool 1012, and when the second clamping tool 1012 is clamped in the vicinity of the second bonding area of the electronic device or on the second bonding area, the second row of probes 1022 is electrically connected to multiple pins in the second bonding area respectively. The second row of probes 1022 is connected to various ports of the first terminal of the second multiplex switch 1032 via a second group of wires 105 respectively, and a port of a second terminal of the second multiplex switch 1032 is connected to the other port of the measurement instrument 106 via another wire. A tester may operate the first multiplex switch 1031 to select any port of the first terminal of the first multiplex switch 1031, so that a connection between the port and a port of the second terminal of the first multiplex switch 1031 is turned on, and thereby a connection between a port of the first terminal and one port of the measurement instrument 106 is turned on through a corresponding pin connected to a corresponding probe in the first row of probes 1021 connected to a corresponding wire in the first group of wires 104. Likewise, the tester may operate the second multiplex switch 1032 to select any port of the first terminal of the second multiplex switch 1032, so that a connection between the port and a port of the second terminal of the second multiplex switch 1032 is turned on, and thereby a connection between a port of the first terminal and the other port of the measurement instrument 106 is turned on through a corresponding pin connected to a corresponding probe in the second row of probes 1022 connected to a corresponding wire in the second group of wires 105. In this way, the corresponding pins connected to the corresponding probes in the first row of probes 1021, the two ports of the measurement instrument 106 and the corresponding pins connected to the corresponding probes in the second row of probes 1022 form a test loop, so that the measurement instrument 106 can be used to test electrical functions between the corresponding pins connected to the corresponding probes in the first row of probes 1021 and the corresponding pins connected to the corresponding probes in the second row of probes 1022.

According to still further embodiments of the present disclosure, the at least one clamping tool 101 comprises a clamping tool, the at least one row of probes 102 comprises a row of probes, the at least one multiplex switch 103 comprising a multiplex switch, multiple ports of the first terminal of the multiplex switch are connected to probes in the row of probes via a group of wires respectively, the second terminal of the multiplex switch comprises two ports capable of being connected to two ports of the measurement instrument via wires respectively, and the multiplex switch is configured to be capable of turning on or turning off an electrical connection between each of the multiple ports of the first terminal and one of the two ports of the second terminal. The apparatus 100 for testing electrical functions according to still further embodiments of the present disclosure can achieve testing of electrical functions of two pins in the bonding area of the electronic device which are connected to any two probes in the at least one row of probes 102, and as only one multiplex switch is included, the apparatus 100 for testing electrical functions is more compact and portable. The multiplex switch in these embodiments can be implemented using a 2-out-of-n multiplex switch, where n is an integer greater than or equal to 2.

The apparatus for testing electrical functions according to the embodiments of the present disclosure has been described above with reference to the accompanying drawings, and it should be noted that the above description and illustration are merely illustrative instead of limiting the present disclosure. In other embodiments of the present disclosure, the apparatus for testing electrical functions according to the embodiments of the present disclosure may have a different structure, may comprise more, fewer or different components, and relationships such as connection, inclusion etc. between various components may be different from those described and illustrated. For example, the measurement instrument may be considered to be located outside of the apparatus for testing electrical functions, or may also be considered to be located within the apparatus for testing electrical functions and so on.

In another aspect, there is also provided a system for testing electrical functions according to an embodiment of the present disclosure, comprising: the apparatus for testing electrical functions according to any of the embodiments of the present disclosure, and the measurement instrument, wherein two ports of the second terminal of the at least one multiplex switch of the apparatus for testing electrical functions are connected to two ports of the measurement instrument via wires respectively to form a test loop. The measurement instrument may be, for example, a multimeter, a capacitance meter, an inductance detector etc.

Figure 4:
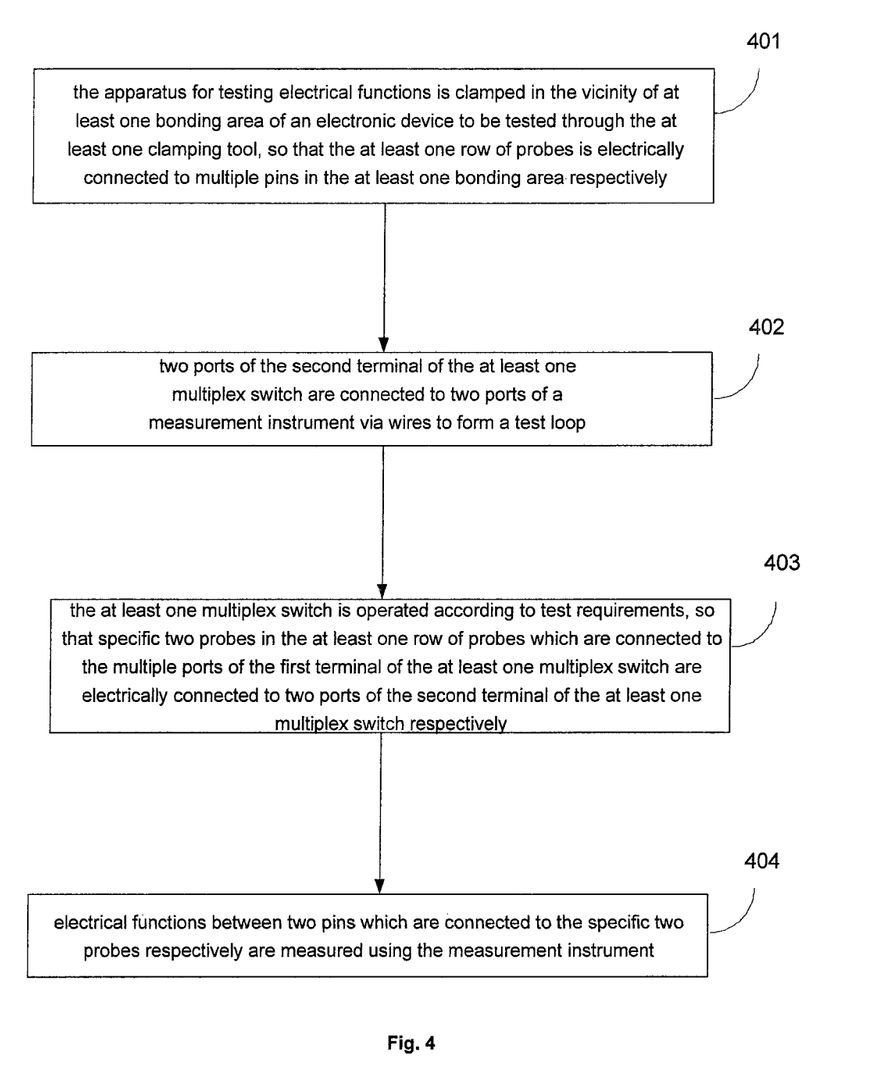
FIG. 4 illustrates a method for testing electrical functions according to an embodiment of the present disclosure.

Referring now to FIG. 4, illustrated is a method for testing electrical functions according to an embodiment of the present disclosure. The method for testing electrical functions may be implemented by the apparatus for testing electrical functions according to the embodiment of the present disclosure described above, and therefore certain aspects of the method have been described above in the description of the apparatus for testing electrical functions described above, and will not be repeated for the sake of brevity. The detailed description of some aspects of the method can be obtained with reference to the above description.

As shown in FIG. 4, the method comprises the following steps. In step 401, the apparatus for testing electrical functions according to the embodiments of the present disclosure is clamped in the vicinity of at least one bonding area of an electronic device to be tested through the at least one clamping tool, so that the at least one row of probes is electrically connected to multiple pins in the at least one bonding area respectively.

In step 402, two ports of the second terminal of the at least one multiplex switch are connected to two ports of a measurement instrument via wires to form a test loop. In step 403, the at least one multiplex switch is operated according to test requirements, so that specific two probes in the at least one row of probes which are connected to the multiple ports of the first terminal of the at least one multiplex switch are electrically connected to two ports of the second terminal of the at least one multiplex switch respectively.

In step 404, electrical functions between two pins which are connected to the specific two probes respectively are measured using the measurement instrument.

In some embodiments, step 404 may comprise: operating the at least one multiplex switch, so that a first group of probes in the at least one row of probes which are connected to the multiple ports of the first terminal of the at least one multiplex switch sequentially turn on an electrical connection with one port of the second terminal of the at least one multiplex switch for a specified time.

In some other embodiments, step 404 may further comprise: in synchronous with the step of the first group of probes sequentially turning on the electrical connection, a second group of probes in the at least one row of probes which are connected to the multiple ports of the first terminal of the at least one multiplex switch sequentially turn on an electrical connection with the other port of the second terminal of the at least one multiplex switch for a specified time.

For example, each probe in the first group of probes in the row of probes may sequentially turn on an electrical connection with a port of a second terminal of the first multiplex switch, and each probe in the second group of probes in the row of probes may sequentially turn on an electrical connection with a port of a second terminal of the second multiplex switch, so as to sequentially test the electrical functions between a pin in a bonding area connected to each probe in the first group of probes and a corresponding pin in the bonding area connected to each probe in the second group of probes. In another example, each probe in the first row of probes may sequentially turn on an electrical connection with a port of a second terminal of the first multiplex switch, and each probe in the second row of probes may synchronously turn on an electrical connection with a port of a second terminal of the second multiplex switch sequentially, so as to sequentially test the electrical functions between a pin in a first bonding area connected to each probe in the first row of probes and a corresponding pin in a second bonding area connected to each probe in the second row of probes.

The method for testing electrical functions according to the embodiment of the present disclosure has been described above with reference to the accompanying drawings, and it is to be noted that the above description is examples only and is not intended to limit the present disclosure. In other embodiments of the present disclosure, the method may have more, fewer or different steps, and the relationship between an order, inclusion, and function between the steps may be different from those described and illustrated. For example, the method for testing electrical functions may realize any of the required test solutions or test sequences using the apparatus for testing electrical functions according to the embodiments of the present disclosure.

It is to be understood that the above embodiments of the present disclosure are merely exemplary embodiments for explaining the principles of the present disclosure, and the present disclosure is not limited thereto. It will be apparent to those skilled in the art that various changes and modifications can be made therein without departing from the spirit and essence of the present disclosure, which are also intended to be within the protection scope of the present disclosure. The protection scope of the present disclosure is defined only by the meaning of the language expression of the appended claims and their equivalents.

We claim:

1. An apparatus for testing electrical functions, comprising:
    at least one clamping tool configured to be capable of being clamped in the vicinity of at least one bonding area of an electronic device;
    at least one row of probes configured to be electrically connected to multiple pins in the at least one bonding area respectively when the at least one clamping tool is clamped in the vicinity of the at least one bonding area of the electronic device; and
    at least one multiplex switch, wherein each multiplex switch has a first terminal comprising multiple ports and connected to at least one group of probes in a row of probes via a group of wires respectively, and a second terminal comprising at least one port and capable of being connected to a measurement instrument via wires, and the at least one multiplex switch is configured to turn on or turn off an electrical connection between each of the multiple ports of the first terminal and at least one port of the second terminal, so that two ports of the measurement instrument are connected to two of the multiple pins respectively via the first terminal and the second terminal of the at least one multiplex switch to form a test loop.

2. The apparatus for testing electrical functions according to claim 1, wherein the at least one clamping tool comprises a clamping tool, the at least one row of probes comprises a row of probes, the at least one multiplex switch comprises a first multiplex switch and a second multiplex switch, multiple ports of a first terminal of the first multiplex switch are connected to a first group of probes in the row of probes via a first group of wires respectively, and multiple ports of a first terminal of the second multiplex switch are connected to a second group of probes in the row of probes via a second group of wires respectively.

3. The apparatus for testing electrical functions according to claim 1, wherein the at least one clamping tool comprises a first clamping tool and a second clamping tool, the at least one row of probes comprises a first row of probes and a second row of probes, and is configured to cause the first row of probes to be electrically connected to multiple pins in a first bonding area of the electronic device respectively when the first clamping tool is clamped in the vicinity of the first bonding area, and cause the second row of probes to be electrically connected to multiple pins in a second bonding area of the electronic device respectively when the second clamping tool is clamped in the vicinity of the second bonding area, the at least one multiplex switch comprises a first multiplex switch and a second multiplex switch, multiple ports of a first terminal of the first multiplex switch are connected to probes in the first row of probes via a first group of wires respectively, and multiple ports of a first terminal of the second multiplex switch are connected to probes in the second row of probes via a second group of wires respectively.

4. The apparatus for testing electrical functions according to claim 1, wherein the at least one clamping tool comprises a clamping tool, the at least one row of probes comprises a row of probes, the at least one multiplex switch comprises a multiplex switch, multiple ports of a first terminal of the multiplex switch are connected to probes in the row of probes via a group of wires respectively, a second terminal of the multiplex switch comprises two ports capable of being connected to two ports of the measurement instrument via wires respectively, and the multiplex switch is configured to be capable of turning on or turning off an electrical connection between each of the multiple ports of the first terminal and one of the two ports of the second terminal.

5. The apparatus for testing electrical functions according to claim 1, wherein each multiplex switch is configured to be capable of controlling turn-on time and/or an on-off order of an electrical connection between each of the multiple ports of the first terminal and at least one port of the second terminal.

6. The apparatus for testing electrical functions according to claim 1, wherein probes in the at least one row of probes have an adjustable spacing.

7. A system for testing electrical functions, comprising:
the apparatus for testing electrical functions according to claim 1, and
the measurement instrument,
wherein two ports of the second terminal of the at least one multiplex switch of the apparatus for testing electrical functions are connected to two ports of the measurement instrument via wires respectively to form the test loop.

8. A method for testing electrical functions by using the apparatus for testing electrical functions according to claim 1, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and
measuring electrical functions between two pins which are connected to the specific two probes respectively using the measurement instrument.

9. The method for testing electrical functions according to claim 8, wherein the step of operating the at least one multiplex switch according to test requirements comprises:
operating the at least one multiplex switch, so that a first group of probes in the at least one row of probes which are connected to the multiple ports of the first terminal of the at least one multiplex switch sequentially turn on an electrical connection with one port of the second terminal of the at least one multiplex switch for a specified time.

10. The method for testing electrical functions according to claim 9, wherein the step of operating the at least one multiplex switch according to test requirements further comprises:
in synchronous with the step of the first group of probes sequentially turning on the electrical connection, turning on, by a second group of probes in the at least one row of probes, an electrical connection with the other port of the second terminal of the at least one multiplex switch for a specified time, wherein the second group of probes are connected to the multiple ports of the first terminal of the at least one multiplex switch sequentially.

11. A system for testing electrical functions, comprising:
the apparatus for testing electrical functions according to claim 2, and
the measurement instrument, wherein two ports of the second terminal of the at least one multiplex switch of the apparatus for testing electrical functions are connected to two ports of the measurement instrument via wires respectively to form the test loop.

12. A system for testing electrical functions, comprising:
the apparatus for testing electrical functions according to claim 3, and
the measurement instrument, wherein two ports of the second terminal of the at least one multiplex switch of the apparatus for testing electrical functions are connected to two ports of the measurement instrument via wires respectively to form the test loop.

13. A system for testing electrical functions, comprising:
the apparatus for testing electrical functions according to claim 4, and
the measurement instrument, wherein two ports of the second terminal of the at least one multiplex switch of the apparatus for testing electrical functions are connected to two ports of the measurement instrument via wires respectively to form the test loop.

14. A system for testing electrical functions, comprising:
the apparatus for testing electrical functions according to claim 5, and
the measurement instrument, wherein two ports of the second terminal of the at least one multiplex switch of the apparatus for testing electrical functions are connected to two ports of the measurement instrument via wires respectively to form the test loop.

15. A system for testing electrical functions, comprising:
the apparatus for testing electrical functions according to claim 6, and
the measurement instrument, wherein two ports of the second terminal of the at least one multiplex switch of the apparatus for testing electrical functions are connected to two ports of the measurement instrument via wires respectively to form the test loop.

16. A method for testing electrical functions by using the apparatus for testing electrical functions according to claim 2, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and
measuring electrical functions between two pins which are connected to the specific two probes respectively using the measurement instrument.

17. A method for testing electrical functions by using the apparatus for testing electrical functions according to claim 3, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and
measuring electrical functions between two pins which are connected to the specific two probes respectively using the measurement instrument.

18. A method for testing electrical functions by using the apparatus for testing electrical functions according to claim 4, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and
measuring electrical functions between two pins which are connected to the specific two probes respectively using the measurement instrument.

19. A method for testing electrical functions by using the apparatus for testing electrical functions according to claim 5, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and
measuring electrical functions between two pins which are connected to the specific two probes respectively using the measurement instrument.

20. A method for testing electrical functions by using the apparatus for testing electrical functions according to claim 6, comprising:
clamping the apparatus in the vicinity of at least one bonding area of an electronic device to be tested through the at least one clamping tool, so that the at least one row of probes is electrically connected to multiple pins in the at least one bonding area respectively;
connecting two ports of the second terminal of the at least one multiplex switch to two ports of a measurement instrument via wires to form the test loop;
operating the at least one multiplex switch according to test requirements, so that specific two probes in the at least one row of probes which are connected to the multiple ports of the first terminal of the at least one multiplex switch are electrically connected to two ports of the second terminal of the at least one multiplex switch respectively; and measuring electrical functions between two pins which are connected to the specific two probes respectively using the measurement instrument.

* * * * *